(12) United States Patent
Nakaoka et al.

(10) Patent No.: US 9,349,585 B2
(45) Date of Patent: May 24, 2016

(54) PATTERN FORMATION METHOD

(71) Applicant: Kabushiki Kaisha Toshiba, Minato-ku (JP)

(72) Inventors: Sonoe Nakaoka, Yokkaichi (JP); Kentaro Matsunaga, Yokkaichi (JP); Eiji Yoneda, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/576,435

(22) Filed: Dec. 19, 2014

(65) Prior Publication Data

US 2016/0064216 A1     Mar. 3, 2016

(30) Foreign Application Priority Data

Aug. 29, 2014    (JP) ................................. 2014-175888

(51) Int. Cl.
| | | |
|---|---|---|
| *G03F 7/004* | (2006.01) | |
| *H01L 21/027* | (2006.01) | |
| *H01L 21/02* | (2006.01) | |
| *H01L 21/311* | (2006.01) | |
| *G03F 1/00* | (2012.01) | |
| *G03F 7/20* | (2006.01) | |
| *G03F 7/38* | (2006.01) | |

(52) U.S. Cl.
CPC ........ *H01L 21/02118* (2013.01); *G03F 1/0046* (2013.01); *G03F 1/144* (2013.01); *G03F 7/004* (2013.01); *G03F 7/2016* (2013.01); *G03F 7/38* (2013.01); *H01L 21/0274* (2013.01); *H01L 21/02348* (2013.01); *H01L 21/31144* (2013.01)

(58) Field of Classification Search
CPC ......... G03F 1/046; G03F 1/144; G03F 7/004; G03F 7/2016; G03F 7/26; G03F 7/38; G03F 7/38; H01L 21/0337; H01L 21/3065; H01L 21/037; H01L 21/3086; H01L 21/3081; H01L 21/027
USPC ........... 430/5, 270.1, 322, 330, 331; 438/689, 438/725, 717, 781, 780
See application file for complete search history.

(56) References Cited

U.S. PATENT DOCUMENTS

| | | | |
|---|---|---|---|
| 7,923,373 B2 | 4/2011 | Sandhu | |
| 7,978,434 B2 | 7/2011 | Kimura et al. | |
| 8,114,301 B2 * | 2/2012 | Millward | ............ B81C 1/00031 216/17 |
| 8,334,089 B2 * | 12/2012 | Yi | ....................... H01L 21/0276 427/558 |

(Continued)

FOREIGN PATENT DOCUMENTS

| | | |
|---|---|---|
| JP | 2008-90956 | 4/2008 |
| JP | 2010-531051 | 9/2010 |

(Continued)

*Primary Examiner* — Amanda C Walke
(74) *Attorney, Agent, or Firm* — Oblon, McClelland, Maier & Neustadt, L.L.P.

(57) ABSTRACT

According to an embodiment, a guide pattern having a first opening pattern and a second opening pattern shallower than the first opening pattern, is formed on a film to be processed. A directed self-assembly material is set into the first and second opening patterns. The directed self-assembly material is phase-separated into first and second phases in the first and second opening patterns. A third opening pattern is formed by removing the first phase. The third opening pattern in the second opening pattern is eliminated, and the second and third opening patterns are transferred to the film to be processed, by one etching to be processed from the tops of the second and third opening patterns.

16 Claims, 4 Drawing Sheets

(56) References Cited

U.S. PATENT DOCUMENTS

| | | | |
|---|---|---|---|
| 8,557,128 B2* | 10/2013 | Millward | B81C 1/00031 |
| | | | 216/17 |
| 8,614,048 B2* | 12/2013 | Ichikawa | C08F 20/06 |
| | | | 430/270.1 |
| 8,703,407 B2 | 4/2014 | Seino et al. | |
| 8,911,846 B2* | 12/2014 | Yang | B32B 27/06 |
| | | | 428/195.1 |
| 8,951,698 B2* | 2/2015 | Taniguchi | G03F 1/70 |
| | | | 430/22 |
| 8,980,538 B2* | 3/2015 | Somervell | 430/313 |
| 8,999,492 B2* | 4/2015 | Millward | 427/487 |
| 9,153,456 B2 | 10/2015 | Nakajima et al. | |
| 2010/0279062 A1* | 11/2010 | Millward | B81C 1/00031 |
| | | | 428/119 |
| 2011/0175228 A1* | 7/2011 | Lazovsky | B82Y 30/00 |
| | | | 257/768 |
| 2013/0224635 A1* | 8/2013 | Takekawa | G03F 7/0002 |
| | | | 430/5 |
| 2014/0021166 A1 | 1/2014 | Seino et al. | |
| 2014/0097152 A1 | 4/2014 | Hieda et al. | |

FOREIGN PATENT DOCUMENTS

| | | |
|---|---|---|
| JP | 5259661 | 8/2013 |
| JP | 2014-22550 | 2/2014 |
| JP | 2014-78540 | 5/2014 |
| JP | 2015-4745 A | 1/2015 |
| WO | WO 2008/150673 A1 | 12/2008 |

* cited by examiner

PATTERN FORMATION METHOD

CROSS-REFERENCE TO RELATED APPLICATIONS

This application is based upon and claims the benefit of priority from Japanese Patent Application No. 2014-175888, filed on Aug. 29, 2014; the entire contents of which are incorporated herein by reference.

FIELD

Embodiments described herein relate to a pattern formation method.

BACKGROUND

In a process of manufacturing a semiconductor device, a directed self-assembly (DSA) process has been developed to form a fine device pattern such as a hole pattern. In the DSA process, a pattern finer than a guide pattern can be formed by phase-separating a DSA material for the guide pattern. By transferring to a film to be processed using this fine pattern, the fine device pattern can be formed on a substrate.

The size of the pattern which can be formed by the DSA process differs according to the characteristic of the DSA material applied. The size of the pattern which can be formed in one process is only one kind. Therefore, when a plurality of the device patterns having different sizes is formed on the same film to be processed using the DSA process, the DSA process is performed a plurality of times according to each device pattern, and many steps, such as a step of transferring each pattern to the film to be processed, are required.

DETAILED DESCRIPTION

According to an embodiment, a guide pattern having a first opening pattern and a second opening pattern shallower than the first opening pattern, is formed on a film to be processed. Next, a directed self-assembly material is set into the first opening pattern and the second opening pattern. Next, the directed self-assembly material is phase-separated into a first phase and a second phase in the first opening pattern and the second opening pattern. Next, a third opening pattern is formed at the first phase in the first opening pattern, and a fourth opening pattern is formed at the first phase in the second opening pattern by removing the second phase while leaving the first phase. Thereafter, the directed self-assembly material which is set into the second opening pattern is removed to eliminate the fourth opening pattern, and the second and third opening patterns are transferred to the film to be processed by one etching to the film to be processed from the tops of the second to fourth opening patterns.

Hereinafter, a pattern formation method according to the embodiments will be described in detail with reference to the attached drawings. The present invention is not limited by these embodiments.

(First Embodiment)

Figure 1A:
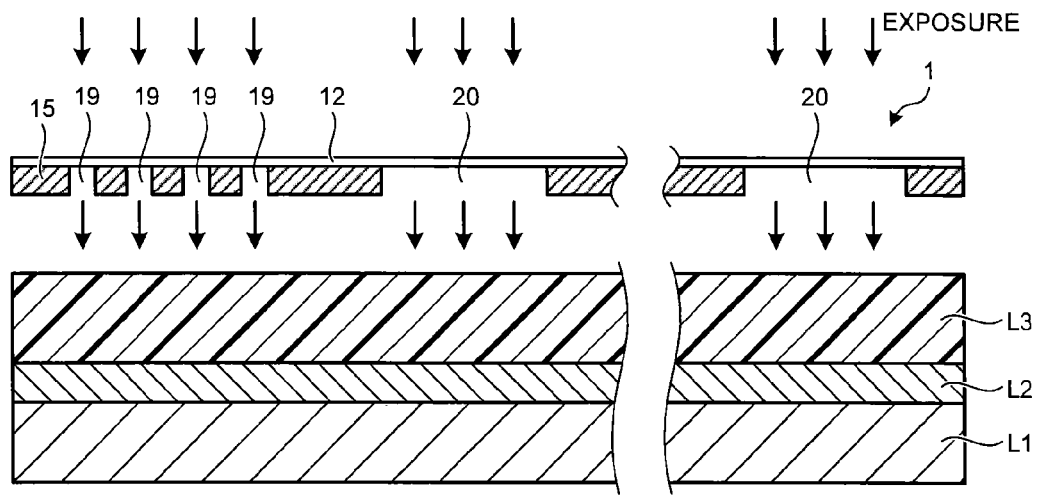
FIGS. 1A to 1C are views illustrating a procedure of a method of forming a guide pattern according to a first embodiment.
Figure 1B:
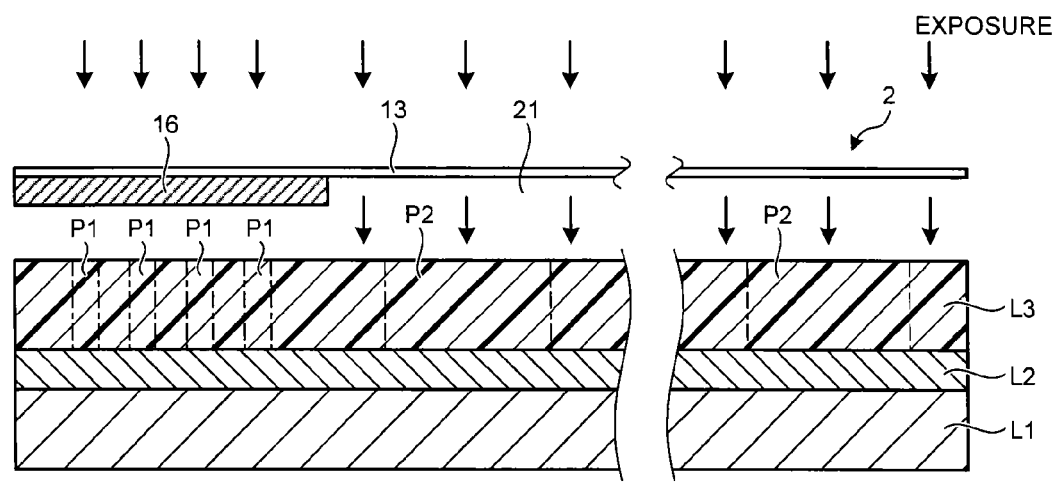
Figure 1C:
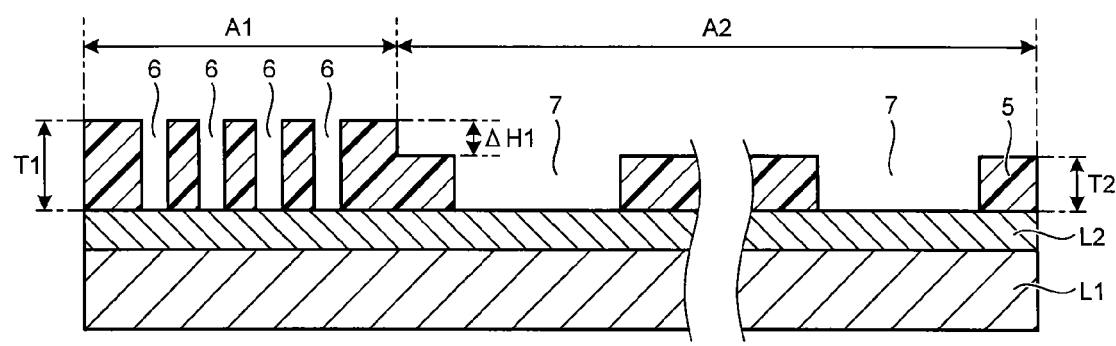

FIGS. 1A to 1C are views illustrating a procedure of a method of forming a guide pattern 5 according to a first embodiment. In the first embodiment, the guide pattern 5 is formed by using a photolithography technique. The guide pattern 5 is used for a DSA process as described below.

First, a film L2 to be processed is formed on a substrate L1 and a resist (guide film) L3 is formed on the film L2 to be processed as illustrated in FIG. 1A. The guide film L3 is formed by applying a photosensitive resin on the film L2 to be processed and performing bake processing (pre applied bake (PAB) processing).

Next, as illustrated in FIG. 1A, a photomask 1 is arranged on the guide film L3 and the guide film L3 is exposed through the photomask 1. The photomask 1 includes a glass substrate 12, a light shielding pattern 15, a plurality of light transmitting patterns 19, and a plurality of light transmitting patterns 20. The light shielding pattern 15 includes a light shielding material or a semi-light shielding material coated on the glass substrate 12. Each of the light transmitting patterns 19 and 20 is formed between the light shielding patterns 15. The light transmittance of each of the light transmitting patterns 19 and 20 is higher than that of the light shielding pattern 15. In the example illustrated, although the size of each of the light transmitting patterns 19 is formed smaller than the size of each of the light transmitting patterns 20, the size of each of the light transmitting patterns 19 may be formed equal to or larger than the size of each of the light transmitting patterns 20. The number of each of the light transmitting patterns 19 and 20 may be one. The photomask 1 becomes a binary mask, for example, when the light shielding pattern 15 includes a light shielding material. The photomask 1 may be a halftone mask in which the light shielding pattern 15 includes a semi-light shielding material and has light transmittance. The light shielding pattern 15 and the plurality of light transmitting patterns 19 and 20 become a mask pattern to form opening patterns 6 and 7 illustrated in FIG. 1C.

Next, as illustrated in FIG. 1B, a photomask 2, different from the photomask 1, is arranged on the guide film L3, and the guide film L3 is exposed through the photomask 2. In this case, a part P1 to be exposed and its periphery are covered with a light shielding pattern 16 of the photomask 2, and a part P2 to be exposed and its periphery are covered with each of light transmitting patterns 21 of the photomask 2. The part P1 to be exposed is a part of the guide film L3, which has been exposed through each of the light transmitting patterns 19 of the photomask 1. The part P2 to be exposed is a part of the guide film L3, which has been exposed through the light transmitting pattern 20 of the photomask 1. The photomask 2 includes a glass substrate 13, the light shielding pattern 16, and the light transmitting pattern 21. The light shielding pattern 16 includes a light shielding material or a semi-light shielding material coated on the glass substrate 13. The light transmitting pattern 21 is formed at the periphery of the light shielding pattern 16. The light transmittance of the light transmitting pattern 21 is higher than that of the light shielding pattern 16. The photomask 2 becomes the binary mask, for example, when the light shielding pattern 16 includes a light shielding material. The photomask 2 may be the halftone mask in which the light shielding pattern 16 includes a semi-light shielding material and has light transmittance. The light shielding pattern 16 and the light transmitting pattern 21 become a mask pattern to form guide regions A1 and A2 illustrated in FIG. 1C.

Next, by performing bake processing (post exposure bake (PEB) processing) and developing processing on the guide film L3 illustrated in FIG. 1B, the mask patterns of the photomasks 2 and 3 are transferred to the guide film L3 and the guide pattern 5 is formed as illustrated in FIG. 1C. The guide pattern 5 is a remaining pattern of the guide film L3 and includes the plurality of opening patterns 6, the plurality of opening patterns 7, and the guide regions A1 and A2. Each of the opening patterns 6 is formed by removing the part P1 to be exposed and by transferring each of the light transmitting patterns 19 of the photomask 1 to the guide film L3. As a result, each of the opening patterns 6 becomes a trimmed pattern of the guide film L3. Each of the opening patterns 7 is formed by removing the part P2 to be exposed and by transferring each of the light transmitting patterns 20 of the photomask 1 to the guide film L3. As a result, each of the opening patterns 7 becomes a trimmed pattern of the guide film L3. In the example illustrated, although the number of each of the opening patterns 6 and 7 is plural, it may be one corresponding to the mask pattern of the photomask 1. The guide regions A1 and A2 are formed by removing parts to be exposed (not illustrated) which have been exposed through the photomask 2. The guide region A1 is formed corresponding to the light shielding pattern 16 of the photomask 2 and surrounds each of the opening patterns 6. The guide region A2 is formed corresponding to the light transmitting pattern 21 of the photomask 2 and surrounds each of the opening patterns 7. As described above, since the light transmittance of the light transmitting pattern 21 of the photomask 2 is higher than that of the light shielding pattern 16, in the guide pattern 5, the guide film L3 is removed more in the guide region A2 than in the guide region A1. Therefore, a height (film thickness) T2 (nm) of the guide pattern 5 from the film L2 to be processed in the guide region A2 is formed smaller than the film thickness T1 (nm) of the guide pattern 5 in the guide region A1. That is, in the guide pattern 5, a magnitude relation (T1>T2) of the film thickness T1 and T2 is satisfied, and a step ΔH1 is provided between the guide region A1 and the guide region A2. The film thickness T1 and T2 can be adjusted by adjusting the light transmittance of the light shielding pattern 16 and the light transmitting pattern 21 of the photomask 2. Since the opening patterns 6 and 7 are formed as trimmed patterns of the guide film, it can be said that the opening pattern 7 is formed shallower than the opening pattern 6, corresponding to the magnitude relation (T1>T2) of the film thickness T1 and T2.

Figure 2A:
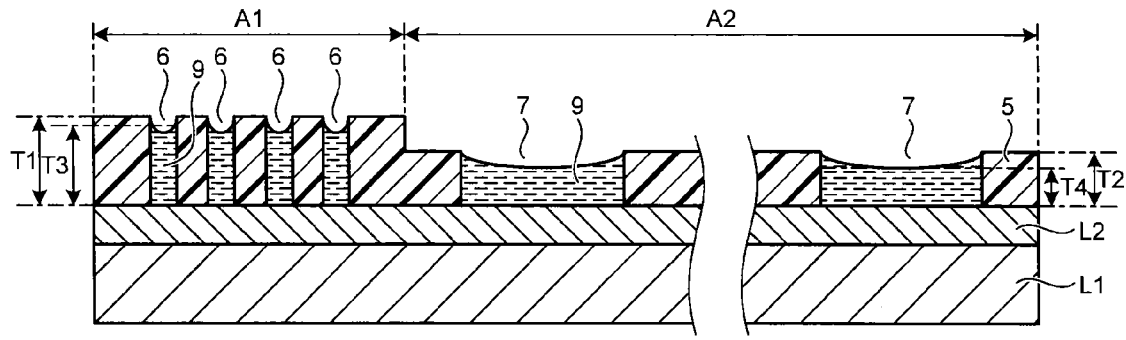
FIGS. 2A to 2D are views illustrating a procedure of a method of forming device patterns having different sizes on a film to be processed by a DSA process using the guide pattern illustrated in FIGS. 1A to 1D.
Figure 2B:
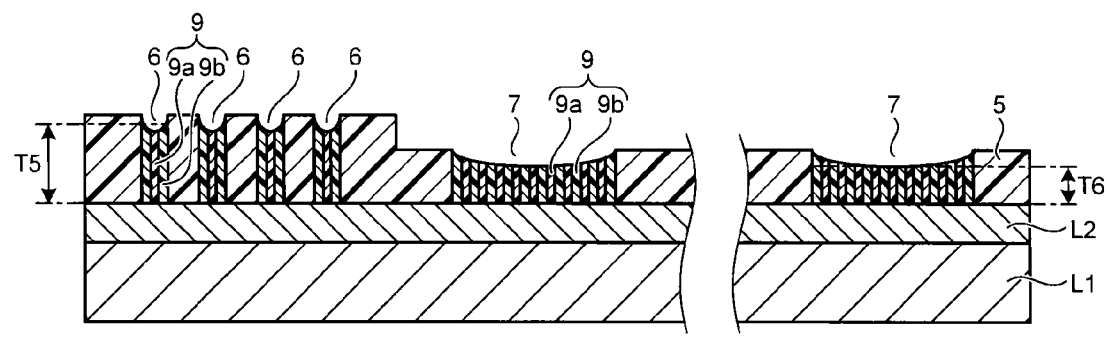
Figure 2C:
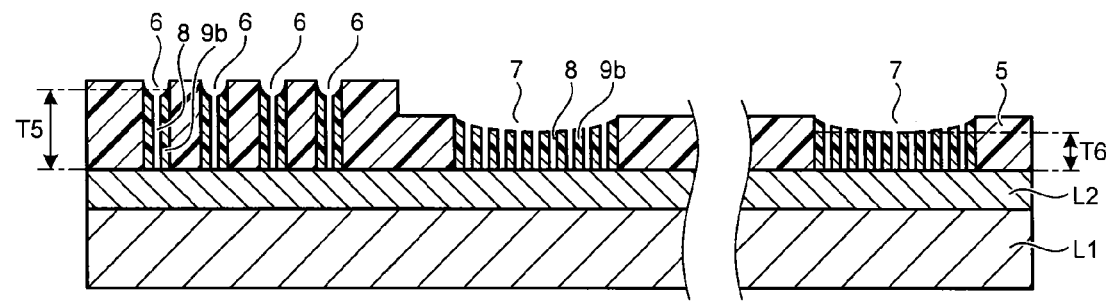
Figure 2D:
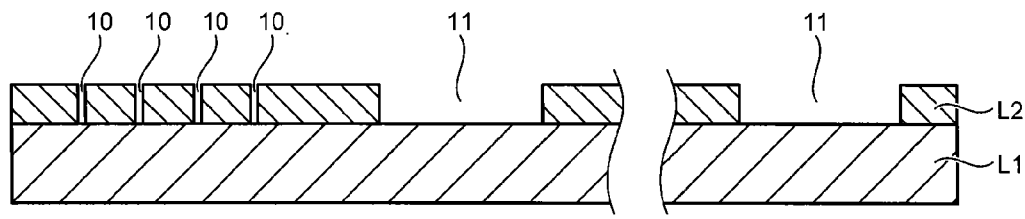

FIGS. 2A to 2D are views illustrating a procedure of a method of forming device patterns 10 and 11 having different sizes on the film L2 to be processed by a DSA process using the guide pattern 5 illustrated in FIG. 1C. The device pattern 10 illustrated in FIG. 2D is the fine trimmed pattern formed on the film L2 to be processed, and the size thereof is not more than a minimum size in optical contrast of an exposure device, for example, when it is a hole pattern. When such fine device patterns 10 are densely formed on the film L2 to be processed, manufacturing cost of a semiconductor device can be reduced by using the DSA process. If the dense device patterns 10 are formed without using the DSA process, there is a limitation on a distance between holes of the device patterns 10 which can be formed by one exposure process. Therefore, a plurality of exposure processes using the expensive exposure device is required, and the manufacturing cost of the semiconductor device increases according to the increase in the number of processes.

First, as illustrated in FIG. 2A, each of the opening patterns 6 and 7, which is formed between the guide patterns 5, is filled with a DSA material 9 as a directed self-assembly material by the method such as a spin coating method or an ink-jet method. In this case, the film thickness T3 (nm) of the DSA material 9 in each of the opening patterns 6 is smaller than the film thickness T1 of the guide pattern 5 in the guide region A1 due to interface energy. The film thickness T4 (nm) of the DSA material 9 in each of the opening patterns 7 is smaller than the film thickness T2 of the guide pattern 5 in the guide region A2 due to the interface energy. In addition, each of the opening patterns 6 and 7 is filled with the DSA material 9 so that the film thickness T4 is smaller than the film thickness T3. That is, a magnitude relation (T1>T3, T2>T4, T3>T4) is satisfied for the film thickness T1 to T4. The guide pattern 5 has a role in storing the DSA material 9 in each of the opening patterns 6 and 7, and the magnitude relation (T1>T2) of the film thickness T1 and T2 is satisfied as described above. Therefore, by filling each of the opening patterns 6 and 7 with the DSA material 9 to the fullest, the magnitude relation (T3>T4) of the DSA material 9 described above is satisfied inevitably. As long as the magnitude relation (T3>T4) is satisfied, each of the opening patterns 6 and 7 does not necessarily have to be filled with the DSA material 9 to the fullest.

Here, the DSA material 9 includes a block copolymer. The block copolymer has a structure in which plural kinds of polymer chains are bonded. Each polymer chain has a chain structure of a monomer of one kind. This block copolymer has a structure in which a polymer chain having high affinity with the guide pattern 5 and a polymer chain having low affinity with the guide pattern 5 are bonded. As such a block copolymer, for example, a polystyrene (hereinafter referred to as "PS")-polymethylmethacrylate (hereinafter referred to as "PMMA") block copolymer can be used. In a case where the PS-PMMA block copolymer is used, if the guide pattern 5 is formed of a hydrophobic material, the polymer chain having high affinity with the guide pattern 5 becomes hydrophobic PS, and the polymer chain having low affinity with the guide pattern 5 becomes hydrophilic PMMA.

Next, annealing treatment is performed on the DSA material 9 as illustrated in FIG. 2A, and the block copolymer of the DSA material 9 is directed self-assembled as illustrated in FIG. 2B. That is, the DSA material 9 is phase-separated into two phases 9a and 9b in each of the opening patterns 6 and 7. The phase 9a is formed by aggregating polymer chains having low affinity with the guide pattern 5. The phase 9b is formed by aggregating polymer chains having high affinity with the guide pattern 5. As the example described above, when the guide pattern 5 is formed of a hydrophobic material, and the block copolymer is the PS-PMMA block copolymer, the phase 9a is the PMMA aggregated and the phase 9b is the PS aggregated. The shape and position of each of the phases 9a and 9b are determined by a DSA condition (shape, etc. of the DSA material 9 or the guide pattern 5). This DSA condition is adjusted so that at least one phase 9a is cylindrically formed near the center of the phase 9b in each of the opening patterns 6. The phase 9a in the example illustrated penetrates the DSA material 9 and reaches the film L2 to be processed. However, the phase 9a may not penetrate the DSA material 9 and not reach the film L2 to be processed depending on the DSA condition. In addition, in the example illustrated, the plurality of phases 9a is cylindrically formed at a substantially constant pitch at the phase 9b in each of the opening patterns 7. However, directed self-assemblage is not necessarily performed in such a regular manner in each of the opening patterns 7. The DSA material 9 maintains the magnitude relation (T3>T4) of the film thickness T3 and T4 before annealing treatment also after the annealing treatment. Therefore, the film thickness T6 (nm) of the DSA material 9 (for example, the phase 9b) after annealing treatment in each of the opening patterns 7 is smaller than the film thickness T5 (nm) of the DSA material 9 (for example, the phase 9b between the phase 9a and the guide pattern 5) after the annealing treatment in each of the opening patterns 6. That is, a magnitude relation (T5>T6) of the film thickness T5 and T6 has been satisfied.

Next, the phases 9a illustrated in FIG. 2B are selectively removed. For example, the polymer chains (for example, PMMA) aggregated at the phase 9a are decomposed by irradiating each of the opening patterns 6 and 7 with ultraviolet light of 172 nm using an Xe2 excimer lamp. Next, an organic solvent such as developer or alcohol is discharged into each of the opening patterns 6 and 7. Then, decomposed matters of the polymer chains aggregated at the phase 9a are removed by wet etching. By this processing, the phase 9a is removed and a fine opening pattern 8 as illustrated in FIG. 2C is formed in each of the opening patterns 6 and 7 as a processing trace. Each of the opening patterns 8 is smaller than each of the opening patterns 6 and 7, since each of the opening patterns 8 is formed by attaching the aggregated polymer chain (for example, PS) to the side wall of each of the opening patterns 6 and 7 as the phase 9b. The size of each of the opening patterns 8 is not more than the minimum size in the optical contrast of the exposure device, for example, when it is a hole pattern. When the DSA material 9 in each of the opening patterns 7 illustrated in FIG. 2B has not been directed self-assembled in a regular manner, the opening pattern 8, which is arranged regularly as illustrated in FIG. 2C, is not necessarily formed in each of the opening patterns 7.

Next, as illustrated in FIG. 2C, the guide pattern 5 in which each of the opening patterns 6 and 7 is covered with the phases 9b is used as an etching mask. The film L2 to be processed is etched, for example, by dry etching and device patterns 10 and 11 are formed as illustrated in FIG. 2D. In this etching process, etching time is t (second), an etching rate of the phase 9b is R1 (nm/second), and an etching rate of the guide pattern 5 is R2 (nm/second). The film thickness T5 of the phase 9b between the guide pattern 5 and the opening pattern 8 is formed so that a magnitude relation (T5≥(R1×t)) is satisfied in the relation with an etching depth (R1×t). The film thickness T1 and T2 of the guide pattern 5 is formed so that a magnitude relation (T1, T2≥(R2×t)) is satisfied in the relation with an etching depth (R2×t). That is, the phase 9b and the guide pattern 5 formed in each of the opening patterns 6 have enough etching resistance In addition, the etching time t is set so that the desired device patterns 10 and 11 are formed at the film L2 to be processed, in consideration of an etching rate of the film L2 to be processed in addition to the etching rates R1 and R2. Therefore, in the etching process, the fine device pattern 10 is formed as illustrated in FIG. 2D by transferring the fine opening pattern 8 formed in each of the opening patterns 6 to the film L2 to be processed. The device pattern 10 is the trimmed pattern of the film L2 to be processed, and the size thereof, corresponding to the size of the opening pattern 8 when it is a hole pattern, is not more than the minimum size in the optical contrast of the exposure device.

Since the magnitude relation (T5>T6) of the film thickness T5 and T6 of the phase 9b has been satisfied as described above, a magnitude relation ((R1×t)>T6) of the film thickness T6 is satisfied in the relation with the etching depth (R1×t). Therefore, the etching resistance of the phase 9b formed in each of the opening patterns 7 is insufficient. Therefore, in the processes in FIGS. 2C and 2D, the phase 9b formed in each of the opening patterns 7 is removed by etching, and each of the opening patterns 7 is transferred to the film L2 to be processed, and the device pattern 11 which is larger than the device pattern 10 is formed, while the fine opening pattern 8 formed in each of the opening patterns 6 is transferred to the film L2 to be processed by the etching process. That is, the device patterns 10 and 11 having different sizes are formed at the film L2 to be processed by one etching process. The number of the device patterns 10 formed in this way is the same as the number of the fine opening patterns 8 formed in the opening patterns 6. In addition, the number of the device patterns 11 is the same as the number of the opening patterns 7.

As a comparative example (not illustrated), it is assumed that the film thickness T6 of the phase 9b illustrated in FIG. 2C and formed in each of the opening patterns 7 is formed so that a magnitude relation (T6≥(R1×t)) is satisfied in the relation with the etching depth (R1×t). In this comparative example, contrary to the first embodiment, the phase 9b formed in each of the opening patterns 7 has enough etching resistance. Therefore, the phase 9b is not removed by etching while the opening pattern 8 formed in each of the opening patterns 6 described above is transferred to the film L2 to be processed. Thus, the fine opening pattern 8 formed in each of the opening patterns 7 is transferred to the film L2 to be processed. For this reason, when the device pattern 11 illustrated in FIG. 2D is formed at the film L2 to be processed, an additional process (for example, a photolithography process or an etching process) to remove a transfer pattern of the opening pattern 8 through such an opening pattern 7, is required. However, this results in increase of the manufacturing cost of the semiconductor device, since the number of processes, in which the device pattern 11 is formed at the film L2 to be processed, increases compared with that of the first embodiment.

Finally, the guide pattern 5 and the phase 9b, which are not removed in the etching process and remain on the film L2 to be processed, are completely removed by a solvent, etc. In this manner, a formation process of the device patterns 10 and 11 in the film L2 to be processed is completed.

In the first embodiment, the DSA material 9 is directed self-assembled after the magnitude relation (T3>T4) of the film thickness T3 and T4 of the DSA material 9 is satisfied. Therefore, the magnitude relation (T5>T6) of the film thickness T5 and T6 of the phase 9b can be satisfied. Therefore, in the first embodiment, the phase 9b formed in the guide pattern 5 and the opening pattern 6 and having excellent etching resistance can function as a mask for etching the film L2 to be processed, by satisfying a magnitude relation (T5≥(R1×t)>T6) for the film thickness T5 and T6 of the phase 9b and the etching depth (R1×t). As a result, each of the opening patterns 8 formed in the opening pattern 6 and each of the opening patterns 7 are simultaneously transferred to the film L2 to be processed by one etching, and the plurality of device patterns 10 and 11 having different sizes can be formed. That is, according to the first embodiment, the plurality of device patterns 10 and 11 having different sizes can be formed at the film L2 to be processed with a small number of processes. As a result, the manufacturing cost of the semiconductor device can be reduced.

In addition, in the first embodiment, the magnitude relation (T1>T2) is satisfied for the film thickness T1 and T2 of the guide pattern 5. Therefore, the magnitude relation (T3>T4) of the film thickness T3 and T4 of the DSA material 9 can be satisfied only by filling the opening patterns 6 and 7 with the DSA material 9 to the fullest. That is, according to the first embodiment, the magnitude relation (T3>T4) of the DSA material 9 can be easily satisfied.

(Second Embodiment)

Figure 3A:
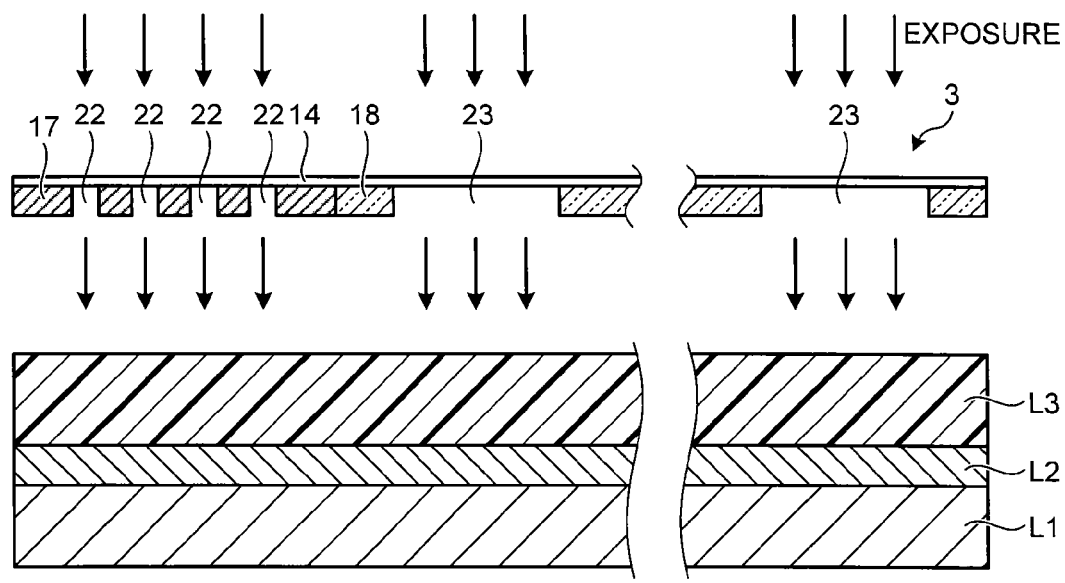
FIGS. 3A and 3B are views illustrating a procedure of a method of forming a guide pattern according to a second embodiment.
Figure 3B:
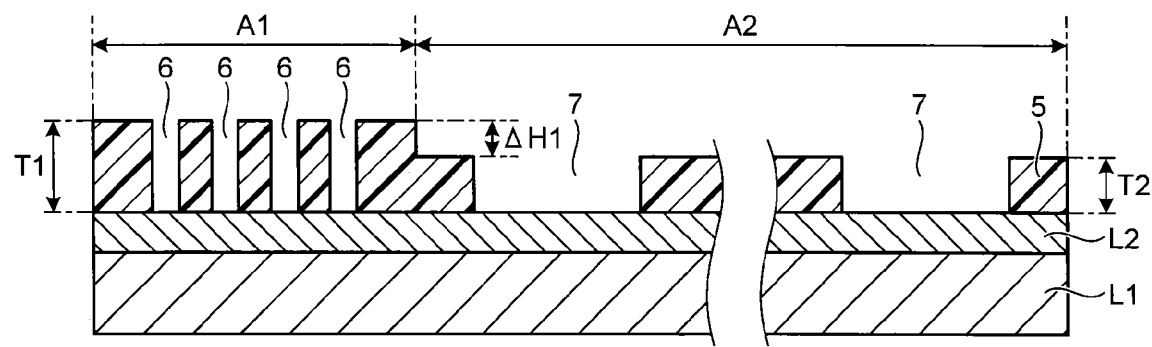

FIGS. 3A and 3B are views illustrating a procedure of a method of forming a guide pattern 5 according to a second embodiment. The second embodiment differs from the first embodiment in that the guide pattern 5 is formed by one exposure process. Hereinafter, the same reference numerals are given to similar configurations to the first embodiment, and the overlapping descriptions will be omitted.

First, as illustrated in FIG. 3A, a guide film L3 is formed on a film L2 to be processed formed on a substrate L1, as with the first embodiment.

Next, a photomask 3 is arranged above the guide film L3 and the guide film L3 is exposed through the photomask 3 as illustrated in FIG. 3A. The photomask 3 includes a glass substrate 14, light shielding patterns 17 and 18, a plurality of light transmitting patterns 22, and a plurality of light transmitting patterns 23. The light shielding pattern 17 includes a light shielding material or a semi-light shielding material coated on the glass substrate 14. The light shielding pattern 18 includes a semi-light shielding material coated on the glass substrate 14 and the light transmittance thereof is higher than that of the light shielding pattern 17. Each of the light transmitting patterns 22 is formed between the light shielding patterns 17. Each of the light transmitting patterns 23 is formed between the light shielding patterns 18. The light transmittance of each of the light transmitting patterns 22 and 23 is higher than that of the light shielding patterns 17 and 18. The light shielding pattern 17 and the light transmitting pattern 22 configure a part or whole of a first mask area not illustrated. The light shielding pattern 18 and the light transmitting pattern 23 configure a part or whole of the first mask area not illustrated. In the example illustrated, although the size of each of the light transmitting patterns 22 is formed smaller than the size of each of the light transmitting patterns 23, it may be formed equal to or larger than the size of the light transmitting pattern 23. The number of each of the light transmitting patterns 22 and 23 may be one. The light shielding pattern 17 and each of the light transmitting patterns 22 become a mask pattern to form each of opening patterns 6 and a guide region A1 illustrated in FIG. 3B. The light shielding pattern 18 and each of the light transmitting patterns 23 become a mask pattern to form each of opening patterns 7 and a guide region A2 illustrated in FIG. 3B.

Next, by performing bake processing (PEB processing) and developing processing on the guide film L3 illustrated in FIG. 3A, the mask pattern of the photomask 3 is transferred to the guide film L3 and the guide pattern 5 is formed as illustrated in FIG. 3B. The guide pattern 5 has a similar configuration to the first embodiment and is a remaining pattern of the guide film L3. The guide pattern 5 includes the plurality of opening patterns 6, the plurality of opening patterns 7, and the guide regions A1 and A2. The opening pattern 6 becomes a trimmed pattern of the guide film L3. The opening pattern 6 is formed by removing a part to be exposed (not illustrated) that has been exposed through the light transmitting pattern 22 and transferring each of the light transmitting patterns 22 to the guide film L3. The opening pattern 7 becomes a trimmed pattern of the guide film L3. The opening pattern 7 is formed by removing a part to be exposed (not illustrated) that has been exposed through the light transmitting pattern 23 and transferring each of the light transmitting patterns 23. In the example illustrated, although the number of each of the opening patterns 6 and 7 is plural, it may be one corresponding to the mask pattern of the photomask 3. The guide regions A1 and A2 are formed by removing the parts to be exposed (not illustrated) that have been exposed through the light shielding patterns 17 and 18. The guide region A1 is formed corresponding to the light shielding pattern 17 and surrounds each of the opening patterns 6. The guide region A2 is formed corresponding to the light shielding pattern 18 and surrounds each of the opening patterns 7. Since the light transmittance of the light shielding pattern 18 is higher than that of the light shielding pattern 17, the guide film L3 is removed more in the guide region A2 than in the guide region A1. Therefore, also in the second embodiment, a magnitude relation (T1>T2) of the film thickness T1 and T2 is satisfied for the guide pattern 5. In the second embodiment, the film thickness T1 and T2 can be adjusted by adjusting the light transmittance of the light shielding patterns 17 and 18.

According to the second embodiment, the guide pattern 5 similar to that of the first embodiment is formed by one exposure process through the photomask 3. Therefore, the guide pattern 5 can be formed with less number of the exposure processes than the first embodiment. Thus, the manufacturing cost of the semiconductor device can be reduced.

(Third Embodiment)

Figure 4A:
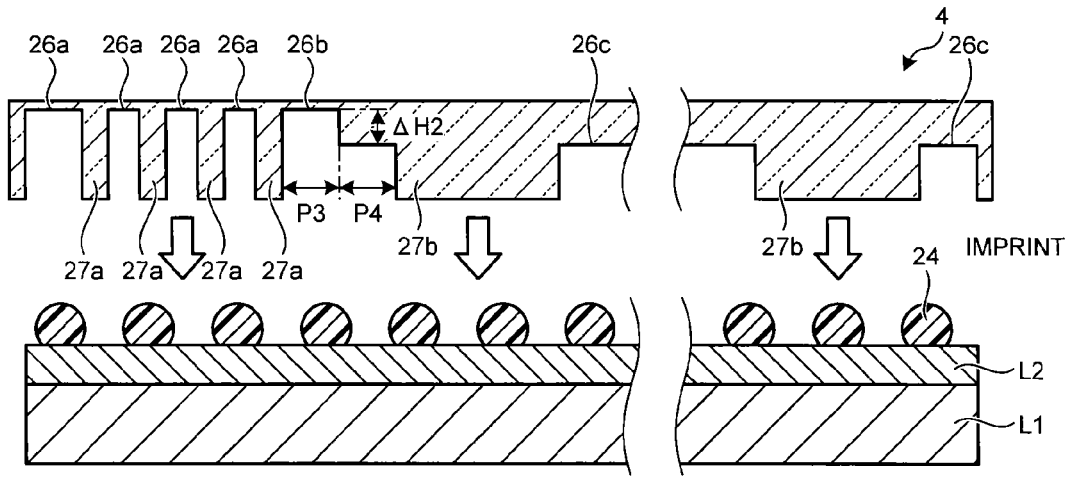
FIGS. 4A to 4C are views illustrating a procedure of a method of forming a guide pattern according to a third embodiment.
Figure 4B:
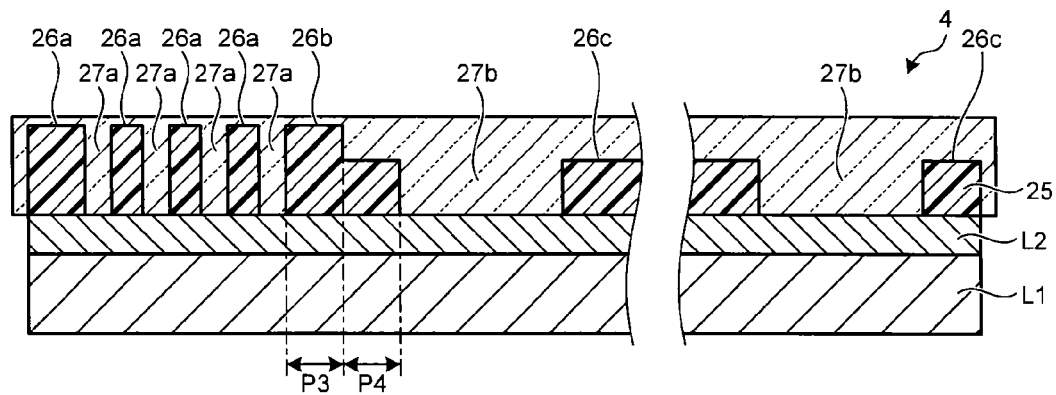
Figure 4C:
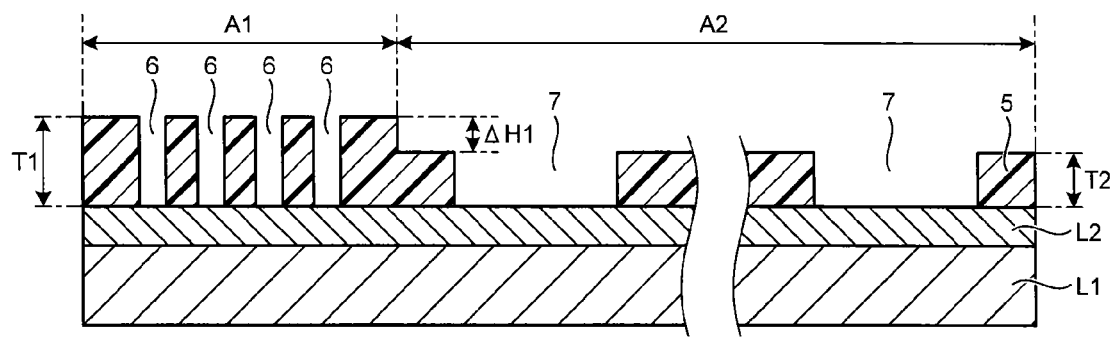

FIGS. 4A to 4C are views illustrating a procedure of a method of forming a guide pattern 5 according to a third embodiment. The third embodiment differs from the first embodiment in that the guide pattern 5 is formed by using a nano-imprint-lithography technique. Hereinafter, the same reference numerals are given to similar configurations to the first embodiment, and the overlapping descriptions will be omitted.

As illustrated in FIG. 4A, an imprint material 24 is applied on a film L2 to be processed formed on a substrate L1 by an ink jet method. The imprint material 24 may be applied on the film L2 to be processed by a spin coating method. For example, an ultraviolet curing resin or a thermosetting resin can be used for the imprint material 24.

Next, a template 4 is arranged above the imprint material 24 and the film L2 to be processed as illustrated in FIG. 4A, and an imprint pattern 25 is formed on the film L2 to be processed by pressing (imprinting) the template 4 onto the imprint material 24 as illustrated in FIG. 4B. In the template 4, a plurality of recessed portions 26a, a recessed portion 26b, a plurality of recessed portions 26c, a plurality of protruded portions 27a, and a plurality of protruded portions 27b which define the shape of the imprint pattern 25 are formed. The recessed portions 26a to 26c are partitioned by the protruded portions 27a and 27b. Each of the recessed portions 26a is formed deeper than each of the recessed portions 26c. The recessed portion 26b has a deep part P3 and a shallow part P4 across a step ΔH2. The deep part P3 is formed deeper than each of the recessed portions 26c. The shallow part P4 is formed shallower than each of the recessed portions 26a and the deep part P3. The number of the recessed portions 26a and 26c and the protruded portions 27a and 27b may be one. When each of the protruded portions 27a and 27b of the template 4 is pressed onto the imprint material 24, the imprint material 24 is absorbed by each of the recessed portions 26a to 26c by a capillary phenomenon, and the imprint pattern 25 corresponding to the shape of each of the recessed portions 26a to 26c is formed. The template 4 can include quartz capable of transmitting ultraviolet light.

Next, as illustrated in FIG. 4B, the imprint pattern 25 is cured while the template 4 remains pressed onto the imprint pattern 25, and the guide pattern 5 is collectively formed as illustrated in FIG. 4C. When the ultraviolet curing resin is used for the imprint material 24, the imprint pattern 25 is irradiated with ultraviolet light. As a result, the imprint pattern 25 is cured and becomes the guide pattern 5. When the thermosetting resin is used for the imprint material 24, the imprint pattern 25 is heated. As a result, the imprint pattern 25 is cured and becomes the guide pattern 5.

Also in the third embodiment, the guide pattern 5 has a plurality of opening patterns 6, a plurality of opening patterns 7, and guide regions A1 and A2 as with the first embodiment. Each of the opening patterns 6 is formed by transferring each of the protruded portions 27a of the template 4 to the imprint material 24. Each of the opening patterns 7 is formed by transferring each of the protruded portions 27b of the template 4 to the imprint material 24. In the example illustrated, although the number of each of the opening patterns 6 and 7 is plural, it may be one corresponding to the shape of the template 4. The guide region A1 is formed corresponding to each of the recessed portions 26a and the deep part P3 of the recessed portion 26b, and surrounds each of the opening patterns 6. The guide region A2 is formed corresponding to the shallow part P4 of the recessed portion 26b and each of the recessed portions 26c, and surrounds the opening pattern 7. As described above, in the recessed portion 26b of the template 4, the step ΔH2 is provided on the border between the deep part P3 and the shallow part P4. Therefore, also in the third embodiment, in the guide pattern 5, a step ΔH1 is provided between the guide region A1 and the guide region A2 corresponding to the step ΔH2, and a magnitude relation (T1>T2) of the film thickness T1 and T2 is satisfied. The film thickness T1 and T2 can be adjusted by adjusting the depth of each of the recessed portions 26a to 26c of the template 4.

According to the third embodiment, the guide pattern 5 is formed by pressing the template 4, which defines the shape of the guide pattern 5, onto the imprint material 24 coated on the film L2 to be processed. Therefore, the guide pattern 5 can be collectively formed without using the photolithography technique.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method comprising:
   forming a guide pattern on a film, the guide pattern have a first opening pattern and a second opening pattern shallower than the first opening pattern;
   setting a directed self-assembly material into the first opening pattern and the second opening pattern
   phase-separating the directed self-assembly material into a first phase and a second phase in the first opening pattern and the second opening pattern;
   forming a third opening pattern at the first phase in the first opening pattern and forming a fourth opening pattern at the first phase in the second opening pattern by removing the second phase while leaving the first phase; and
   etching the film to be processed from the tops of the third and fourth opening patterns to remove the directed self-assembly material which is set into the second opening pattern, to eliminate the fourth opening pattern, and to transfer the second and third opening patterns to the film.

2. The pattern formation method according to claim 1, wherein,
   when forming the guide pattern, the guide pattern is formed such that the film thickness of the guide pattern is equal to or more than a first etching depth in the transferring at a position where the guide pattern has been formed, and
   when forming the third and fourth opening patterns, the first phase is formed such that the film thickness of the first phase in the first opening pattern is equal to or more than a second etching depth in the transferring at a position where the first phase has been formed, and the directed self-assembly material is processed such that the film thickness of the directed self-assembly material in the second opening pattern is smaller than a third etching depth in the transferring at a position where the directed self-assembly material has been set at the second opening pattern.

3. The pattern formation method according to any one of claim 1, wherein
   when forming the guide pattern, the guide pattern is formed such that the guide pattern has a first guide region and a second guide region, and
   the guide pattern surrounds the first opening pattern in the first guide region and surrounds the second opening pattern in the second guide region.

4. The pattern formation method according to claim 3, wherein the guide pattern has a step between the first guide region and the second guide region.

5. The pattern formation method according to claim 4, wherein when forming the guide pattern, the guide pattern is formed by exposing a guide film formed on the film to be processed through a first photomask and a second photomask.

6. The pattern formation method according claim 5,
   wherein when forming the guide pattern, the first guide region and the second guide region are formed by providing a step at the guide film by removing an exposed part of the guide film which has been exposed through the first photomask and has been further exposed through the second photomask.

7. The pattern formation method according to claim 4, wherein when forming the guide pattern, the guide pattern is formed by exposing once the guide film formed on the film to be processed through a photomask.

8. The pattern formation method according to claim 7, wherein the photomask has a first mask area used for forming the first opening pattern and a second mask area used for forming the second opening pattern, and
   mask patterns having different light transmittance are respectively arranged on the first mask area and the second mask area.

9. The pattern formation method according to claim 8,
   wherein the first mask area has a first light transmitting pattern and a first light shielding pattern,
   the second mask area has a second light transmitting pattern and a second light shielding pattern,
   the first light transmitting pattern is formed between the first light shielding patterns, and the light transmittance of the first light transmitting pattern is higher than those of the first and second light shielding patterns,
   the second light transmitting pattern is formed between the second light shielding patterns, and the light transmittance of the second light transmitting pattern is higher than those of the first and second light shielding patterns,
   the light transmittance of the second light shielding pattern is higher than that of the first light shielding pattern, and
   when forming the guide pattern, the first opening pattern and the second opening pattern are formed by removing the exposed part of the guide film which has been exposed through the first and second light transmitting patterns, and the first guide region and the second guide region are formed by providing the step at the guide film by removing the exposed part of the guide film which has been exposed through the first and second light shielding patterns.

10. The pattern formation method according to claim 4, wherein when forming the guide pattern, the guide pattern is formed by pressing a template onto an imprint material coated on the film to be processed.

11. The pattern formation method according to claim 10, wherein
the template has a recessed pattern corresponding to a shape of the guide pattern, and
when forming the guide pattern, the guide pattern is formed by curing the imprint material with which the recessed pattern has been set.

12. The pattern formation method according to claim 1,
wherein the directed self-assembly material includes a block copolymer in which a first polymer chain and a second polymer chain are bonded,
the first phase is a phase in which the first polymer chains are aggregated, and
the second phase is a phase in which the second polymer chains are aggregated.

13. The pattern formation method according to claim 12,
wherein the guide pattern is hydrophobic,
the first polymer chain is polystyrene, and
the second polymer chain is polymethylmethacrylate.

14. The pattern formation method according to claim 1, wherein the directed self-assembly material is a DSA material.

15. A pattern formation method comprising:
setting a directed self-assembly material into a first opening pattern and a second opening pattern which has been formed on a film and making the film thickness of a directed self-assembly material in the second opening pattern smaller than the film thickness of the directed self-assembly material in the first opening pattern;
phase-separating the directed self-assembly material into a first phase and a second phase in the first opening pattern and the second opening pattern;
forming a third opening pattern at the first phase in the first opening pattern and forming a fourth opening pattern at the first phase in the second opening pattern by removing the second phase while leaving the first phase; and
etching the film to be processed from the tops of the third and fourth opening patterns to remove the directed self-assembly material which is set in the second opening pattern, to eliminate the fourth opening pattern, and to transfer the second and third opening patterns to the film.

16. A pattern formation method comprising:
exposing a upper layer formed on a upper side of a film through a first photomask;
exposing the upper layer on the upper side of the film through a second photomask;
forming a guide pattern on the film, the guide pattern have a first opening pattern and a second opening pattern shallower than the first opening pattern;
setting a directed self-assembly material into the first opening pattern and the second opening pattern
phase-separating the directed self-assembly material into a first phase and a second phase in the first opening pattern and the second opening pattern;
forming a third opening pattern at the first phase in the first opening pattern and forming a fourth opening pattern at the first phase in the second opening pattern by removing the second phase while leaving the first phase; and
etching the film to be processed from the tops of the third and fourth opening patterns to remove the directed self-assembly material which is set in the second opening pattern and to eliminate the fourth opening pattern, and to transfer the second and third opening patterns to the film.

* * * * *